United States Patent
Zhao

(10) Patent No.: US 11,864,445 B2
(45) Date of Patent: Jan. 2, 2024

(54) DISPLAY PANEL

(71) Applicant: Wuhan China Star Optoelectronics Semiconductor Display Technology Co., Ltd., Hubei (CN)

(72) Inventor: Kaixiang Zhao, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 377 days.

(21) Appl. No.: 17/275,208

(22) PCT Filed: Dec. 15, 2018

(86) PCT No.: PCT/CN2018/121358
§ 371 (c)(1),
(2) Date: Mar. 11, 2021

(87) PCT Pub. No.: WO2020/113661
PCT Pub. Date: Jun. 11, 2020

(65) Prior Publication Data
US 2022/0052126 A1   Feb. 17, 2022

(30) Foreign Application Priority Data
Dec. 7, 2018 (CN) .......................... 201811497449.8

(51) Int. Cl.
*H01L 27/32* (2006.01)
*H10K 59/35* (2023.01)
(Continued)

(52) U.S. Cl.
CPC ....... *H10K 59/353* (2023.02); *H01L 27/1222* (2013.01); *H10K 59/1213* (2023.02); *H10K 59/352* (2023.02); *H01L 27/1214* (2013.01)

(58) Field of Classification Search
CPC ..................... H10K 59/352; H10K 59/35–353
See application file for complete search history.

(56) References Cited

U.S. PATENT DOCUMENTS

2017/0278906 A1* 9/2017 Song .................... H10K 59/121
2018/0013092 A1* 1/2018 Park .................... H10K 50/8426
(Continued)

FOREIGN PATENT DOCUMENTS

| CN | 105206213 A | * 12/2015 | ............... G09G 3/20 |
| CN | 105629596 | 6/2016 | |

(Continued)

OTHER PUBLICATIONS

Translation, Written Opinion of the International Searching Authority, International Searching Authority, International application No. PCT/CN2018/121358, dated Sep. 3, 2019, all pages. (Year: 2019).*

(Continued)

*Primary Examiner* — Victoria K. Hall

(57) ABSTRACT

A display panel, comprising a plurality of sub-pixels of at least one color provided corresponding to a display area. The peripheral sub-pixels of the sub-pixels provided along the edge of the display area are edge sub-pixels, and the remaining sub-pixels surrounded by the edge sub-pixels and located in the display area are internal sub-pixels; a portion of the plurality of sub-pixels in the display area is a display pixel portion, and the edge contour of the display pixel portion is formed by the edge sub-pixels; the shape of the edge sub-pixels in the plurality of sub-pixels is different from that of the internal sub-pixels of the same color; the edge sub-pixels in the plurality of sub-pixels fill an area between the internal sub-pixels and the edge of the display area, so that the edge contour shape of the display pixel portion is consistent with that of the display area.

6 Claims, 3 Drawing Sheets

(51) Int. Cl.
  *H10K 59/121* (2023.01)
  *H01L 27/12* (2006.01)

(56) References Cited

U.S. PATENT DOCUMENTS

2019/0198581 A1* 6/2019 Kim ................ H10K 77/10
2019/0305057 A1* 10/2019 Cheng ............. H10K 59/122

FOREIGN PATENT DOCUMENTS

| CN | 105629596 | A | * | 6/2016 | ........... G02F 1/1335 |
| CN | 107526201 | | | 12/2017 | |
| CN | 105206213 | | | 1/2018 | |
| CN | 108538895 | A | * | 9/2018 | ........... H10K 59/532 |
| CN | 108648677 | | | 10/2018 | |
| CN | 108648677 | A | * | 10/2018 | ............... G09G 3/20 |
| CN | 108665842 | | | 10/2018 | |
| CN | 108665842 | A | * | 10/2018 | ............... G09G 3/20 |
| KR | 10-2014-0061064 | | | 5/2014 | |
| KR | 10-2014-0061064 | A | * | 5/2014 | ............... G09G 5/37 |

OTHER PUBLICATIONS

Translation, International Search Report, International Searching Authority, International application No. PCT/CN2018/121358, dated Sep. 3, 2019, all pages. (Year: 2019).*

Machine translation, Wu, Chinese Pat. Pub. No. CN-105629596-A, translation date: Apr. 21, 2023, Espacenet, all pages. (Year: 2023).*

Machine translation, Song, Korean Pat. Pub. No. KR101488343B1, translation date: Apr. 21, 2023, Espacenet, all pages. (Year: 2023).*

Machine translation, Sun, Chinese Pat. Pub. No. CN-108665842-A, translation date: Apr. 21, 2023, Espacenet, all pages. (Year: 2023).*

Machine translation, Yuan, Chinese Pat. Pub. No. CN-108648677-A, translation date: Apr. 21, 2023, Espacenet, all pages. (Year: 2023).*

Machine translation, Lv, Chinese Pat. Pub. No. CN-108538895-A, translation date: May 18, 2023, Clarivate Analytics, all pages. (Year: 2023).*

Machine translation, Yan, Chinese Pat. Pub. No. CN-105206213-A, translation date: Apr. 21, 2023, Espacenet, all pages. (Year: 2023).*

* cited by examiner

DISPLAY PANEL

RELATED APPLICATIONS

This application is a National Phase of PCT Patent Application No. PCT/CN2018/121358 having International filing date of Dec. 15, 2018, which claims the benefit of priority of Chinese Patent Application No. 201811497449.8 filed on Dec. 7, 2018. The contents of the above applications are all incorporated by reference as if fully set forth herein in their entirety.

FIELD AND BACKGROUND OF THE INVENTION

The present disclosure relates to a technical field of display devices, and more particularly to a display panel with a special-shaped display edge.

The organic light emitting diode display (OLED) display devices have the advantages of self-luminous light, low driving voltage, high luminous efficiency, short response time, high definition and contrast, wide viewing angle of 180 degrees, wide use temperature range, for realizing flexible display and large-area full-color display and the like, and are recognized as the most development potential display devices.

An OLED display device generally includes a substrate, an anode disposed on the substrate, a hole injection layer disposed on the anode, a hole transport layer disposed on the hole injection layer, a light emitting layer disposed on the hole transport layer, an electron transport layer disposed on the light emitting layer, an electron injection layer disposed on the electron transport layer, and a cathode disposed on the electron injection layer. The light emitting principle of the OLED display devices is that the semiconductor material and the organic light-emitting material are driven by the electric field, and the light emitting is caused by carrier injection and combination. Specifically, the OLED display devices typically adopt an ITO pixel electrode and a metal electrode as the anode and the cathode of the devices. Under certain voltage driving, electrons and holes are respectively injected from the cathode and the anode to the electron transport layer and the hole transport layer. Electrons and holes migrate through the electron transport layer and the hole transport layer to the light-emitting layer and meet each other in the light-emitting layer to form excitons and excite the light-emitting molecules for exciting, and the molecules emits emit visible light by radiation.

With the development of the OLED technology, the display device gradually tends to be narrow or even frameless, and the display device is taken into consideration from beauty and product quality. The shape of the display panel is not limited to the shape of a rectangle and other regular shapes, or in a special application scene, the display panel is not limited to the shape of a rectangle and other regular shapes. The special-shaped display panel gradually appears in the visual field of people. For example, four corners of the display panel are round corners, or a groove structure is arranged on the display panel and is used for installing a receiver or a camera. In another embodiment, a round or other shape of the display panel is designed.

Since the edge of the special-shaped display panel is a special profile structure, as shown in FIG. 1, the strip-shaped sub-pixels 105 (RGB stripes) cannot fill the whole display area 100, such that the sub-pixels 105 form a stepped structure near the edge of the display panel. When the display panel is used, the user easily includes a sawtooth shape at the special-shaped edge of the display area, so that the display picture quality of the edge of the display panel is poor.

SUMMARY OF THE INVENTION

The present disclosure aims to provide a display panel for solving a problem of a sawtooth shape at the special-shaped edge of a display area and improving the display effect of the display panel.

In order to achieve above-mentioned objective, the present disclosure provides a display panel comprising a display area and a non-display area surrounding the display area, the display panel comprising:

a plurality of sub-pixels corresponding to at least a color arranged in the display area of the display panel;
wherein the sub-pixels arranged at a periphery of the sub-pixels along an edge of the display area are defined as edge sub-pixels, and remaining sub-pixels disposed in the display area surrounded by the edge sub-pixels are defined as internal sub-pixels;
wherein a part of the plurality of sub-pixels in the display area is defined as a display pixel portion, an edge contour of the display pixel portion is formed by the edge sub-pixels, a shape of the edge sub-pixels in the plurality of sub-pixels is different from that of the internal sub-pixels in a same color, and an edge sub-pixels of the plurality of sub-pixels is configured to fill a region between the internal sub-pixels and an edge of the display area, such that the shape of the edge contour of the display pixel portion is consistent with that of an edge contour of the display area.

In an embodiment, the edge sub-pixels extend from the display area to the non-display area, such that a shape of the edge contour of the display pixel portion is consistent with that of the edge contour of the display area.

In an embodiment, the edge sub-pixels are disposed in the display area, and an edge contour shape of the edge sub-pixels near a side of the display area is consistent with that of the display area, such that a shape of the edge contour of the display pixel portion is consistent with that of the edge contour of the display area.

In an embodiment, brightness of the edge sub-pixels is consistent with that of the internal sub-pixels in the same color, such that display brightness of whole display area is uniform.

In an embodiment, each of the edge sub-pixels is correspondingly connected with a first TFT (thin film transistor) that drives the edge sub-pixel for emitting light, and each of the internal sub-pixels is correspondingly connected with a second TFT that drives the internal sub-pixel for emitting light;
wherein an area of the edge sub-pixel is represented as S1, and an area of the internal sub-pixel is represented as S2;
wherein a driving current of the first TFT corresponding to the edge sub-pixel is represented as I1, and a driving current of the second TFT corresponding to the internal sub-pixel is represented as I2;
wherein the driving current I1 of the edge sub-pixel and the driving current I2 of the internal sub-pixel are based on the same color, and both the area S1 of the edge sub-pixel 31 and the area S2 of the internal sub-pixels can be made to satisfy following relation:

$$I1*S1=I2*S2.$$

wherein brightness of the edge sub-pixels is consistent with that of the internal sub-pixels in the same color, such that the display brightness of whole display area is uniform.

In an embodiment, a ratio of a width and a length of a channel of the first TFT corresponding to the edge sub-pixel is defined as W1/L1;

wherein a ratio of a width and a length of a channel of the second TFT of the internal sub-pixel is defined as W2/L2;

wherein the area S1 of the edge sub-pixel and the area S2 of the internal sub-pixels 32 based on the same color are defined, and both the ratio, W1/L1, of the width and the length of the channel of the first TFT corresponding to the edge sub-pixel and the ratio, W2/L2, of the width and the length of the channel of the second TFT of the internal sub-pixel can be made to satisfy the following relation:

$$(W1/L1)/(W2/L2)=S2/S1;$$

wherein the brightness of the edge sub-pixels is consistent with that of the internal sub-pixels in the same color, such that the display brightness of whole display area is uniform.

In an embodiment, each of the edge sub-pixels comprises a red sub-pixel, a green sub-pixel, and a blue sub-pixel, and each of the internal sub-pixels comprises a red sub-pixel, a green sub-pixel, and a blue sub-pixel.

In an embodiment, an area of the edge sub-pixels is greater than an area of the internal sub-pixels based on a same color of the sub-pixels correspondingly.

In an embodiment, the edge sub-pixels and the internal sub-pixels based on a same color of sub-pixels are rectangular in different shapes.

In an embodiment, a shape of an edge contour of the display area comprises an arc line or an oblique line.

The beneficial effects of the present disclosure include: the present disclosure provides a display panel that includes a plurality of sub-pixels corresponding to at least a color arranged in the display area. The sub-pixels arranged at a periphery of the plurality of sub-pixels and arranged along an edge of the display area are defined as edge sub-pixels. The remaining sub-pixels disposed in the display area surrounded by the edge sub-pixels are defined as internal sub-pixels. The part of the plurality of sub-pixels in the display area is a display pixel portion. The edge contour of the display pixel portion is formed by the edge sub-pixels. The shape of the edge sub-pixels in the plurality of sub-pixels is different from that of the internal sub-pixels in the same color. The edge sub-pixels of the plurality of sub-pixels fill a region between the internal sub-pixels and an edge of the display area, such that the shape of the edge contour of the display pixel portion is consistent with that of the edge contour of the display area. The shape of the edge sub-pixel is improved, such that the shape of the edge contour of the display pixel portion is consistent with that of the edge contour of the display area, thereby solving a problem of a sawtooth shape at the special-shaped edge of the display area and improving the display effect of the display panel.

BRIEF DESCRIPTION OF THE SEVERAL VIEWS OF THE DRAWINGS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

In the figures.

DESCRIPTION OF SPECIFIC EMBODIMENTS OF THE INVENTION

The following embodiments refer to the accompanying figures for exemplifying specific implementable embodiments of the present disclosure in a suitable environment. It should be noted that the exemplary described embodiments are configured to describe and understand the present disclosure, but the present disclosure is not limited thereto.

The present disclosure provides a display panel that is mainly used in an OLED display panel. The problem of a sawtooth profile of the special-shaped display edge of the display panel can be effectively solved, and therefore the display effect of the display panel is improved.

Figure 1:
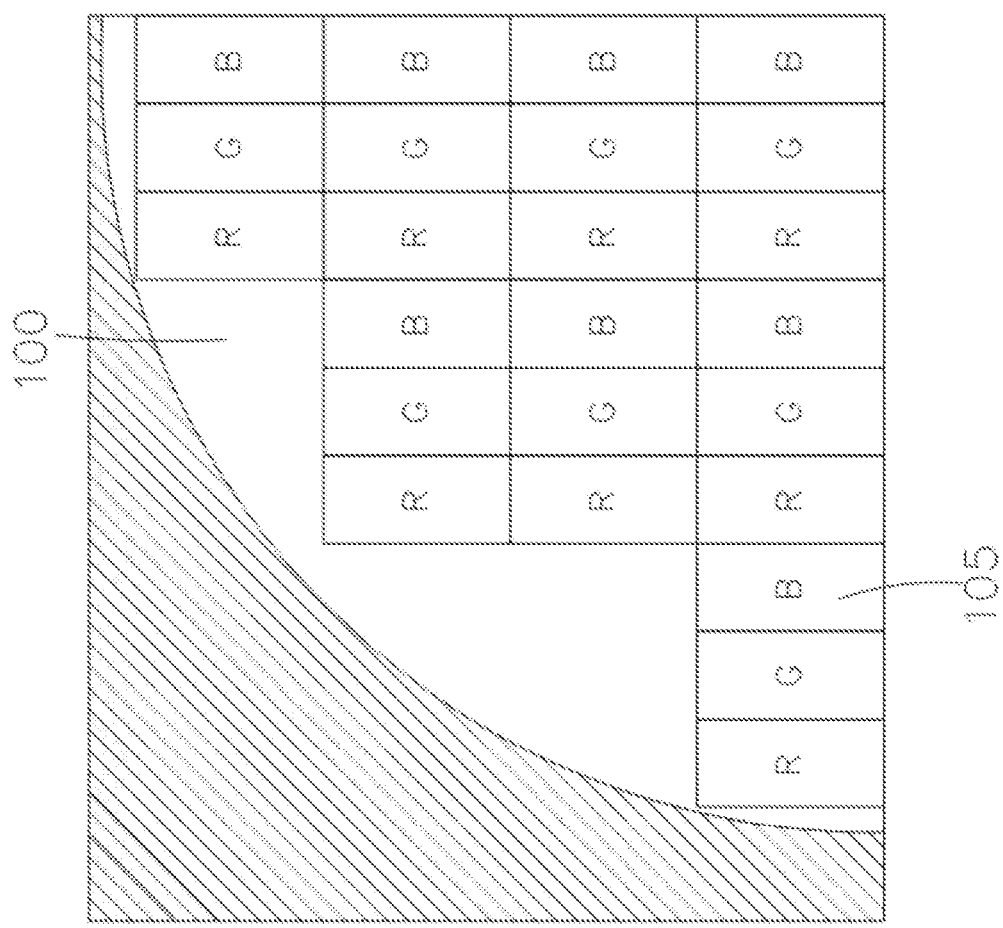
FIG. 1 is a schematic diagram of a conventional display panel at a special-shaped display edge.
Figure 2:
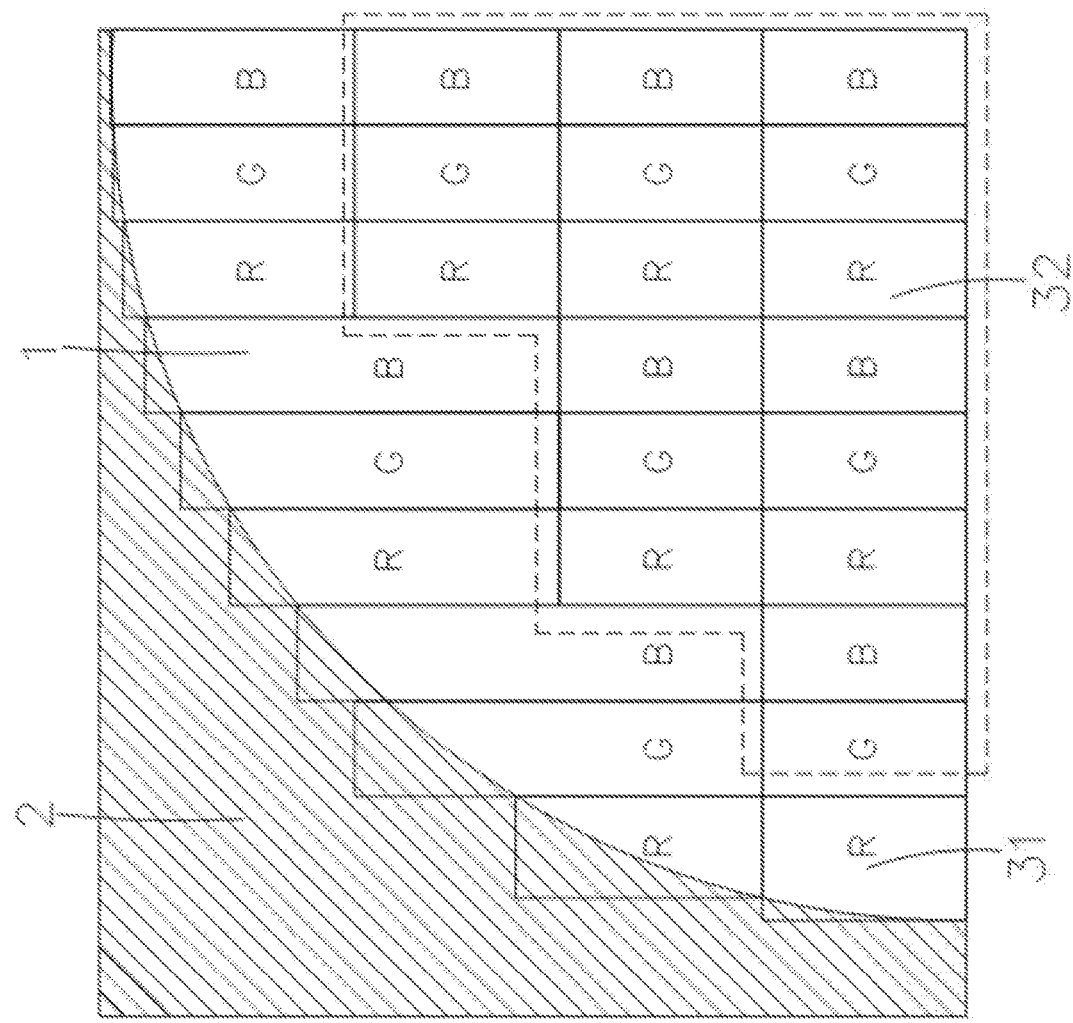
FIG. 2 is a partial schematic diagram of a display panel according to a first embodiment of the present disclosure.

Referring to FIG. 2, a display panel according to a first embodiment of the present disclosure is divided into a display area 1 and a non-display area 2 surrounding the display area 1; and the display panel includes a plurality of sub-pixels corresponding to at least one color arranged in the display area 1.

The sub-pixels arranged along the edge of the display area 1 in the plurality of sub-pixels are defined as edge sub-pixels 31, and the remaining sub-pixels located in the display area 1 surrounded by the edge sub-pixels 31 are defined as internal sub-pixels 32.

The portion of the plurality of sub-pixels in the display area 1 is a display pixel portion, where an edge contour of the display pixel portion is formed by the edge sub-pixel 31. The shape of the edge sub-pixels 31 in the plurality of sub-pixels is different from that of the internal sub-pixels 32 based on the same color of sub-pixels. The edge sub-pixels 31 of the plurality of sub-pixels fills a region area between the internal sub-pixel 32 and an edge of the display area 1, such that the shape of the edge contour of the display pixel portion is consistent with that of the edge contour of the display area 1.

In an embodiment, an area of the edge sub-pixels 31 is greater than an area of the internal sub-pixels 32 based on the same color of sub-pixels correspondingly. The edge sub-pixels 31 extend from the display area 1 to the non-display area 2, such that the shape of the edge contour of the display pixel portion is consistent with that of the edge contour of the display area 1.

In an embodiment, the shape of each of the internal sub-pixels 32 is rectangular.

Additionally, in an embodiment, the edge sub-pixels 31 and the internal sub-pixels 32 based on the same color of sub-pixels are rectangular in different shapes.

In an embodiment, the edge sub-pixel 31 includes a red sub-pixel, a green sub-pixel, and a blue sub-pixel. The internal sub-pixel 32 includes a red sub-pixel, a green sub-pixel, and a blue sub-pixel.

It should be noted that the sub-pixels can be driven to work for emitting light by the driving thin film transistors (TFTs). The driving current provided by the driving thin film transistors satisfies the following formula:

$$I = \frac{W}{2L}\mu C_{ox}(V_{gs} - V_{th})^2$$

Where, "I" is the driving current of the sub-pixel, μ is the electron mobility, Cox is the capacitance between gate-source layers of the driving thin-film transistor of pixels, "W" is a channel width of the driving thin film transistor of pixels, "L" is a channel length of the driving thin film transistor of pixels, Vgs is the gate source voltage of the driving thin film transistors of pixels, and Vth is the threshold voltage of the driving thin film transistor of pixels. It can be found that the driving current is positively related to the electron mobility, the capacitance between gate-source layers, and the channel width, and the driving current is negatively inversely related to the channel length.

In an embodiment, each of the edge sub-pixels 31 is correspondingly connected with a first TFT (thin film transistor) that drives the edge sub-pixel 31 for emitting the light. Each of the internal sub-pixels 32 is correspondingly connected with a second TFT that drives the internal sub-pixel 32 for emitting light.

The area of the edge sub-pixel 31 is represented as S1, the area of the internal sub-pixel 32 is represented as S2, the driving current of the first TFT corresponding to the edge sub-pixel 31 is represented as I1, the driving current of the second TFT corresponding to the internal sub-pixel 32 is represented as I2, a ratio of the width and the length of a channel of the first TFT is represented as W1/L1, and a ratio of the width and the length of a channel of the second TFT is represented as W2/L2.

Therefore, in order to make display brightness of the edge sub-pixel 31 to be the same as that of the internal sub-pixel 32 in a same color, such that the display brightness of the whole display area is uniform.

The driving current I1 of the edge sub-pixel 31 and the driving current I2 of the internal sub-pixel 32 are based on the same color, and both the area S1 of the edge sub-pixel 31 and the area S2 of the internal sub-pixels 32 can be made to satisfy the following relation:

$I1*S1=I2*S2.$

Moreover, the area S1 of the edge sub-pixel 31 and the area S2 of the internal sub-pixels 32 based on the same color are defined, and both a ratio, W1/L1, of the width and the length of the channel of the first TFT corresponding to the edge sub-pixel 31 and a ratio, W2/L2, of the width and the length of the channel of the second TFT of the internal sub-pixel 32 can be made to satisfy the following relation:

$(W1/L1)/(W2/L2)=S2/S1;$

Thus, I1*S1=I2*S2, so that the display brightness of the edge sub-pixel 31 and the internal sub-pixel 32 based on the same color is the same for unifying the display brightness of the whole display area.

In an embodiment, it is assumed that the ratio W2/L2 of the width and the length of a channel of the second TFT corresponding to the internal sub-pixel 32 is 1, the area S2 of the internal sub-pixel 32 is 1, and the area of the edge sub-pixel 31 of the same color is 1.5. The brightness of the edge sub-pixel 31 is consistent with the brightness of the internal sub-pixel 32 of the same color, such that the brightness of the edge display area relative to a main display area is uniform and thus, the display brightness of the whole display area is uniform, if the ratio W1/L1 of the width and the length of the channel of the first TFT corresponding to the edge sub-pixel 31 is defined as 2/3.

Figure 3:
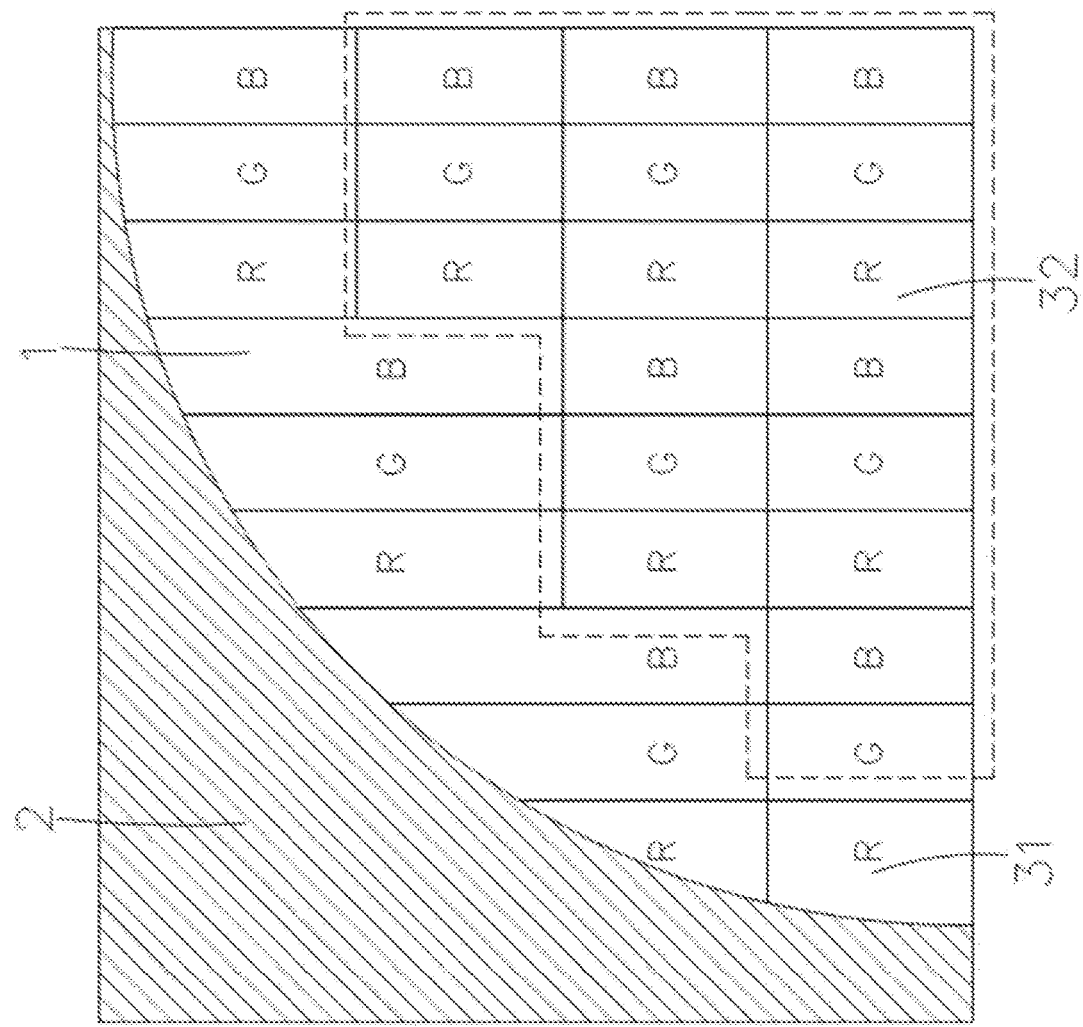
FIG. 3 is a partial schematic view of a display panel according to a second embodiment of the present disclosure.

Referring to FIG. 3, a display panel according to a second embodiment of the present disclosure is provided. Compared with the first embodiment, the display panel in the second embodiment of the present disclosure, the edge sub-pixels 31 are disposed in the display area 1, and an edge contour shape of the edge sub-pixels 31 near a side of the display area 1 is consistent with that of the display area 1, such that the shape of the edge contour of the display pixel portion is consistent with that of the edge contour of the display area 1. Other technical features of the first embodiment are the same as those of the first embodiment, and are not described in detail herein.

The present disclosure provides to improve the shape of the edge sub-pixel, such that the shape of the edge contour of the display pixel portion is consistent with that of the edge contour of the display area, thereby solving a problem of a sawtooth shape at the special-shaped edge of the display area and improving the display effect of the display panel. For the edge sub-pixels and the internal sub-pixels that include different areas, the width and the length of the channel corresponding to the driving thin film transistor can be adjusted by adjusting a ratio of the width and the length of the channel, such that the brightness of the edge sub-pixels is consistent with the brightness of the internal sub-pixels in the same color, the brightness of the edge display area relative to a main display area is uniform, and thus, the display brightness of the whole display area is uniform.

In conclusion, the present disclosure provides a display panel that includes a plurality of sub-pixels corresponding to at least a color arranged in the display area. The sub-pixels arranged at a periphery of the plurality of sub-pixels and arranged along an edge of the display area are defined as edge sub-pixels. The remaining sub-pixels disposed in the display area surrounded by the edge sub-pixels are defined as internal sub-pixels. The part of the plurality of sub-pixels in the display area is a display pixel portion. The edge contour of the display pixel portion is formed by the edge sub-pixels. The shape of the edge sub-pixels in the plurality of sub-pixels is different from that of the internal sub-pixels in the same color. The edge sub-pixels of the plurality of sub-pixels fills a region between the internal sub-pixels and an edge of the display area, such that the shape of the edge contour of the display pixel portion is consistent with that of the edge contour of the display area. The shape of the edge sub-pixel is improved, such that the shape of the edge contour of the display pixel portion is consistent with that of the edge contour of the display area, thereby solving a problem of a sawtooth shape at the special-shaped edge of the display area and improving the display effect of the display panel.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A display panel comprising a display area and a non-display area surrounding the display area, the display panel comprising:

a plurality of sub-pixels corresponding to at least a color arranged in the display area of the display panel;

wherein the sub-pixels arranged at a periphery of the sub-pixels along an edge of the display area are defined as edge sub-pixels, and remaining sub-pixels disposed in the display area surrounded by the edge sub-pixels are defined as internal sub-pixels;

wherein a part of the plurality of sub-pixels in the display area is defined as a display pixel portion, an edge contour of the display pixel portion is formed by the edge sub-pixels, a shape of the edge sub-pixels in the plurality of sub-pixels is different from that of the internal sub-pixels in a same color, and at least one of the edge sub-pixels of the plurality of sub-pixels is configured to fill a region between the internal sub-pixels and the edge of the display area, such that a shape of the edge contour of the display pixel portion is consistent with a shape of an edge contour of the display area, wherein each of the edge sub-pixels comprises a red sub-pixel, a green sub-pixel, and a blue sub-pixel, and each of the internal sub-pixels comprises a red sub-pixel, a green sub-pixel, and a blue sub-pixel, and wherein the edge sub-pixels and the internal sub-pixels based on a same color of sub-pixels are rectangular in different shapes.

2. The display panel according to claim 1, wherein the edge sub-pixels extend from the display area to the non-display area, such that the shape of the edge contour of the display pixel portion is consistent with that of the edge contour of the display area.

3. The display panel according to claim 2, wherein an area of the edge sub-pixels is greater than an area of the internal sub-pixels based on a same color of the sub-pixels correspondingly.

4. The display panel according to claim 1, wherein the edge sub-pixels are disposed in the display area, and a shape of an edge contour of the edge sub-pixels near a side of the display area is consistent with that of the display area, such that the shape of the edge contour of the display pixel portion is consistent with that of the edge contour of the display area.

5. The display panel according to claim 1, wherein brightness of the edge sub-pixels is consistent with that of the internal sub-pixels in the same color.

6. The display panel according to claim 1, wherein the shape of the edge contour of the display area comprises an arc line or an oblique line.

* * * * *